(12) United States Patent
Byeon et al.

(10) Patent No.: US 8,369,122 B2
(45) Date of Patent: Feb. 5, 2013

(54) SEMICONDUCTOR APPARATUS

(75) Inventors: Sang Jin Byeon, Ichon-shi (KR); Jae Jin Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/838,332

(22) Filed: Jul. 16, 2010

(65) Prior Publication Data
US 2011/0187429 A1 Aug. 4, 2011

(30) Foreign Application Priority Data

Jan. 29, 2010 (KR) ........................ 10-2010-0008636

(51) Int. Cl.
G11C 5/00 (2006.01)
G11C 5/02 (2006.01)
G11C 5/06 (2006.01)
G11C 7/00 (2006.01)
G11C 8/00 (2006.01)

(52) U.S. Cl. ....... 365/51; 365/52; 365/194; 365/230.03; 365/233.1; 365/233.12; 365/233.13

(58) Field of Classification Search ............... 365/51, 365/52, 63, 189.05, 193, 194, 230.03, 233.1, 365/233.12, 233.13; 327/158; 257/686, 257/777
See application file for complete search history.

(56) References Cited

U.S. PATENT DOCUMENTS

| | | | |
|---|---|---|---|
| 5,940,328 A * | 8/1999 | Iwamoto et al. ............... 365/193 |
| 6,026,051 A | 2/2000 | Keeth et al. | |
| 6,160,731 A | 12/2000 | Choi | |
| 6,198,649 B1 * | 3/2001 | Matsudera et al. ............. 365/63 |
| 6,349,399 B1 | 2/2002 | Manning | |
| 6,618,319 B2 * | 9/2003 | Ooishi et al. .................. 365/194 |
| 6,636,110 B1 | 10/2003 | Ooishi et al. | |
| 7,055,012 B2 | 5/2006 | LaBerge et al. | |
| 7,072,243 B2 * | 7/2006 | Nakamura et al. ............ 365/194 |
| 7,102,905 B2 * | 9/2006 | Funaba et al. ................. 365/51 |
| 7,123,497 B2 * | 10/2006 | Matsui et al. .................. 365/51 |
| 7,200,021 B2 * | 4/2007 | Raghuram ..................... 365/51 |
| 7,215,561 B2 * | 5/2007 | Park et al. ...................... 365/52 |
| 7,224,625 B2 | 5/2007 | Dietrich et al. | |
| 7,466,577 B2 * | 12/2008 | Sekiguchi et al. ............. 365/51 |
| 7,746,711 B2 * | 6/2010 | Inaba ............................ 365/193 |
| 7,764,564 B2 * | 7/2010 | Saito et al. ............... 365/230.03 |
| 7,830,692 B2 * | 11/2010 | Chung et al. ................... 365/51 |
| 7,859,117 B2 * | 12/2010 | Peng ............................. 257/777 |
| 7,894,230 B2 * | 2/2011 | Kim ............................... 365/51 |
| 8,031,505 B2 * | 10/2011 | Kang et al. .................... 365/51 |
| 8,054,117 B2 * | 11/2011 | Kim ............................... 327/158 |
| 8,054,663 B2 * | 11/2011 | Chung ........................... 365/51 |
| 2005/0105363 A1 | 5/2005 | Ko | |

FOREIGN PATENT DOCUMENTS

| | | |
|---|---|---|
| JP | 08-077790 | 3/1996 |
| JP | 11-328963 | 11/1999 |
| KR | 1020060004782 | 1/2006 |

* cited by examiner

Primary Examiner — Trong Phan
(74) Attorney, Agent, or Firm — William Park & Associates Ltd.

(57) ABSTRACT

A semiconductor apparatus has a plurality of chips stacked therein. Read control signals for controlling read operations of the plurality of chips are synchronized with a reference clock such that the time taken from the application of a read command to the output of data for each of the plurality of chips is maintained substantially the same.

8 Claims, 3 Drawing Sheets

US 8,369,122 B2

SEMICONDUCTOR APPARATUS

CROSS-REFERENCES TO RELATED APPLICATION

The present application claims priority under 35 U.S.C. §119(a) to Korean Patent Application No. 10-2010-0008636, filed on Jan. 29, 2010, in the Korean Intellectual Property Office, which is incorporated herein by reference in its entirety as if set forth in full.

BACKGROUND

1. Technical Field

Various exemplary aspects of the present invention relate to semiconductor apparatuses and related methods. In particular, certain exemplary aspects relate to a three-dimensional semiconductor apparatus.

2. Related Art

In order to increase the degree of integration of a semiconductor apparatus, a 3D (three-dimensional) semiconductor apparatus has been developed. The 3D semiconductor includes a package of a plurality of stacked chips. The 3D semiconductor apparatus may achieve a maximum degree of integration in the same space as a regular semiconductor by vertically stacking two or more chips.

The 3D semiconductor apparatus may be realized in a variety of ways. For example, a plurality of chips having the same structure are stacked and are connected by wires such as metal wires, and are able to operate as a single semiconductor apparatus.

Recently, a TSV (through-silicon via) type semiconductor apparatus has been disclosed in the art, in which silicon vias vertically pass through a plurality of stacked chips so that all the chips are connected through the silicon vias. Since the through-silicon vias vertically pass through the respective chips, in the TSV type semiconductor apparatus, the size of a package may be efficiently decreased compared to the size of a wired semiconductor apparatus.

In general, the TSV type semiconductor apparatus may be composed of a master chip and a plurality of slave chips which are electrically connected with the master chip through TSVs. For example, the master chip in a memory apparatus includes all logic circuits provided for the operation of the memory apparatus in a peripheral circuit region, and the slave chips include memory cores for data storage and circuits for the operation of the memory cores, so as to operate as a single semiconductor apparatus.

Since a plurality of chips stacked in a 3D semiconductor apparatus operate as a single semiconductor apparatus, they share data input and output. In the wired semiconductor apparatus, the data outputted from the respective stacked chips may be transferred to a controller through input/output lines. In the TSV semiconductor apparatus, the slave chip data may be transmitted to the master chip and thereby outputted through pads disposed on the master chip. In order to improve the operating speed of the semiconductor apparatus, it is necessary to output all the data from the stacked chips at the same time.

However, because the stacked chips have different characteristics due to variations in PVT (process, voltage and temperature), it is difficult for them to perform similarly. More specifically, the different PVT properties create skews between the respective chips. Thus, a skew in data output timing between a chip having a high operating speed and a chip having a low operating speed may result. In order to secure a data valid window in the existence of the skew, therefore, the operating speed of the semiconductor apparatus should be lowered, which is not desirable.

SUMMARY

Accordingly, various exemplary aspects of the invention may provide semiconductor apparatuses and/or methods that may improve the economic efficiency and thereby price competitiveness of a semiconductor apparatus. In particular, a semiconductor apparatus capable of correcting skews of a plurality of stacked chips constituting a single semiconductor apparatus is described herein.

In one exemplary aspect of the present invention, a semiconductor apparatus has a plurality of chips stacked therein, wherein read control signals for controlling read operations of the plurality of chips are synchronized with a reference clock such that the time taken from the application of a read command to the output of data for each of the plurality of chips is maintained substantially the same.

In another exemplary aspect of the present invention, a semiconductor apparatus with first and second chips stacked therein comprises a reference clock generation unit provided in the first chip and configured to generate a reference clock based on a read command; and a second chip synchronization unit provided in the second chip and configured to output the read control signals of the second chip in sync with the reference clock.

BRIEF DESCRIPTION OF THE DRAWINGS

Features, aspects, and exemplary aspects are described in conjunction with the attached drawings, in which.

DETAILED DESCRIPTION

Figure 1:
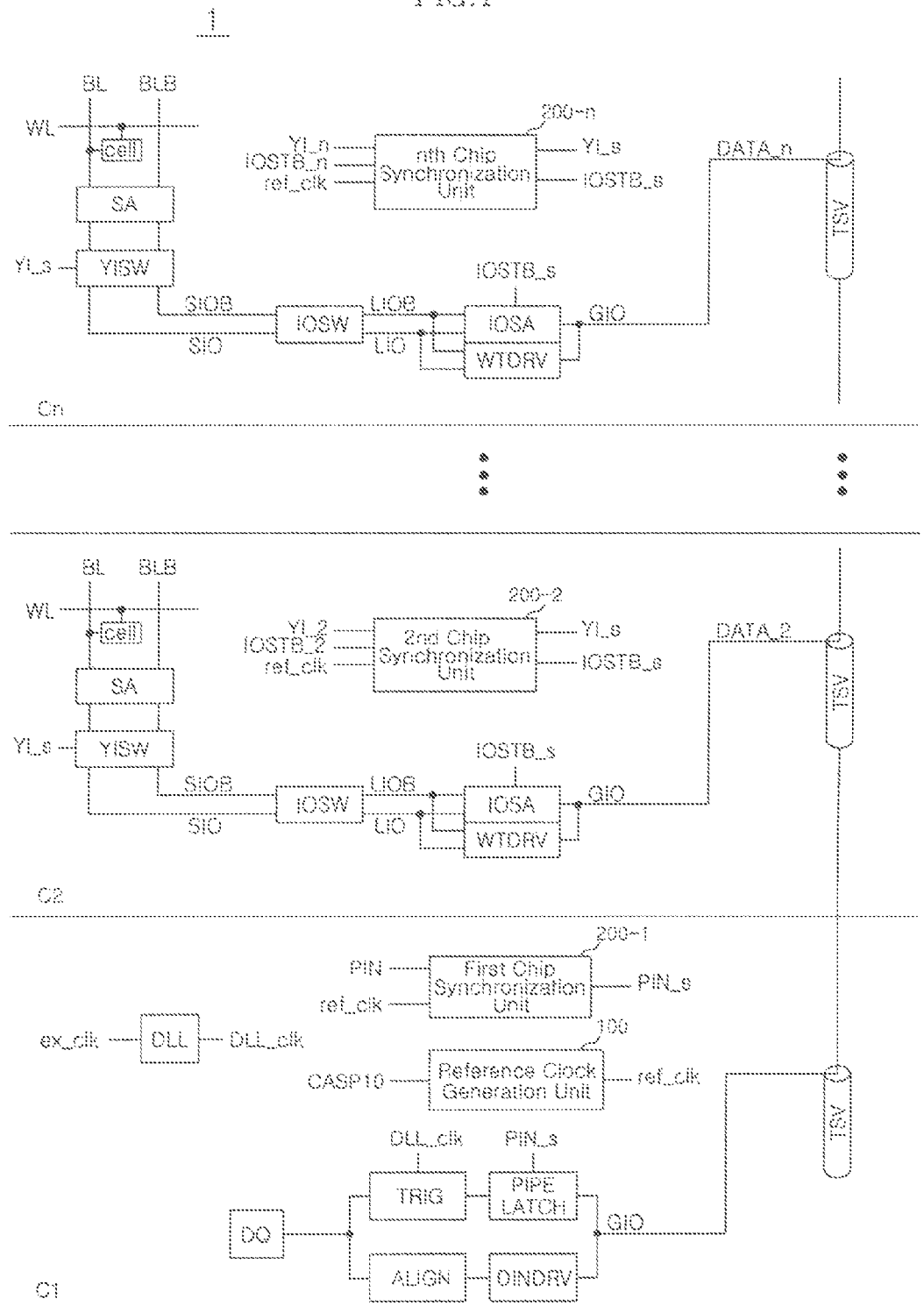
FIG. 1 is a diagram schematically illustrating the configuration of a semiconductor apparatus.

Reference will now be made in detail to the exemplary embodiments consistent with the present disclosure, examples of which are illustrated with reference to the accompanying drawings. Wherever possible, the same reference characters will be used throughout the drawings to refer to the same or like parts.

FIG. 1 is a diagram schematically illustrating the configuration of a semiconductor apparatus consistent with various exemplary aspects of the present invention. In FIG. 1, a semiconductor apparatus 1 includes first to nth chips C1-Cn. The first to nth chips C1-Cn are stacked and constitute a single semiconductor apparatus. The first to nth chips C1-Cn are connected through TSVs (through-silicon vias).

When the semiconductor apparatus uses the TSVs, data outputted from the respective chips are transmitted through the TSVs. Because each chip does not need to have data pads, data pads may be provided one chip out of the stacked chips. The chip with data pads DQ may function as a master chip for communicating with a controller. The other chips, excluding the master chip, may function as slave chips. The master chip is normally provided with a pipe latch PIPE LATCH, a trigger unit TRIG, a data alignment unit ALIGN and an input driver DINDRV, which perform data input/output operations allowing the master chip to communicate with the controller. Each slave chip and/or the master chip is also provided with a read driver IOSA and a write driver WTDRV, which perform core operations. Pads for receiving an external clock ex_clk are provided to the master chip only.

In FIG. 1, the first chip C1 functions as the master chip, and the second to nth chips C2-Cn function as the slave chips. The following description of the nth chip Cn represents the basic structure of all the slave chips. The nth chip Cn includes bit lines BL and BLB as data transmission paths, segment input/output lines SIO and SIOB, local input/output lines LIO and LIOB, and a global input/output line GIO. The nth chip Cn further includes a sense amplifier SA, a column switch YISW, an input/output switch IOSW, the read driver IOSA, and the write driver WTDRV. The read driver IOSA is a circuit associated with the read operation of the nth chip Cn, and the write driver WTDRV is a circuit associated with the write operation of the nth chip Cn.

The read operation of the nth chip Cn with the above-described configuration is begun by an internal read command. The nth chip Cn generates a column selection signal YI and an output strobe signal IOSTB from the internal read command. The column selection signal YI is a signal which controls the column switch YISW, and the output strobe signal IOSTB is a signal which controls the read driver IOSA. Therefore, the column selection signal YI and the output strobe signal IOSTB are read control signals for controlling the read operation of the nth chip Cn. The internal read command is generated from an external read command which is received by the master chip. The master chip receives the external read command and generates the internal read command. The master chip transmits the internal read command to the respective chips for the read operation of the semiconductor apparatus 1.

In the read operation of the nth chip Cn, the data stored in a memory cell 'cell' is loaded on the bit lines BL and BLB when a word line WL is activated, and the sense amplifier SA senses and amplifies the data loaded on the bit lines BL and BLB. The column switch YISW connects the bit lines BL and BLB with the segment input/output lines SIO and SIOB in response to a synchronized column selection signal YI_s, and transmits the data amplified by the sense amplifier SA to the segment input/output lines SIO and SIOB. The input/output switch IOSW connects the segment input/output lines SIO and SIOB to the local input/output lines LIO and LIOB. In response to a synchronized output strobe signal IOSTB_s, the read driver IOSA amplifies the data transmitted through the local input/output lines LIO and LIOB, and transmits the amplified data to the global input/output line GIO. The global input/output line GIO is connected to the TSV. Data DATA_n transmitted through the global input/output line GIO may be transmitted through the TSV to the first chip C1, or the master chip.

The second through n−1th chips C2 through Cn−1, which function as the slave chips, have the same configuration as the nth chip Cn, and perform read operations in the same manner as the nth chip Cn.

Data DATA_2 through DATA_n of the second through nth chips C2 through Cn are transmitted to the first chip C1 through the TSVs. The first chip C1 includes a DLL circuit DLL, the pipe latch PIPE LATCH, the trigger unit TRIG, the data alignment unit ALIGN, and the input driver DINDRV. The DLL circuit DLL receives the external clock ex_clk, which is inputted through a clock pad, and generates a DLL clock DLL_clk.

The pipe latch PIPE LATCH stores and outputs the data DATA_2 through DATA_n of the second through nth chips C2 through Cn transmitted through the TSVs in response to a pipe latch control signal PIN. The trigger unit TRIG outputs the data outputted from the pipe latch PIPE LATCH to the data pad DQ in response to the DLL clock DLL_clk. Therefore, the pipe latch PIPE LATCH and the trigger unit TRIG are circuit components which are associated with the read operation of the semiconductor apparatus 1. Also, the pipe latch control signal PIN is a read control signal which controls the read operation of the first chip C1.

The data alignment unit ALIGN aligns the external data which is inputted through the data pad DQ, and the input driver DINDRV amplifies the output of the data alignment unit ALIGN and transmits the amplified data to the TSV. The data transmitted to the TSV may be transmitted to and stored in the second to nth chips C2-Cn. In other words, the data alignment unit ALIGN and the input driver DINDRV are circuit components associated with the write operation of the semiconductor apparatus 1.

The read operation of the semiconductor apparatus 1 will be described below in detail. When a read command is applied to the semiconductor apparatus 1, the first chip C1 generates the pipe latch control signal PIN based on the read command and transmits the read command to the second to nth chips C2-Cn. The second to nth chips C2-Cn generate the read control signals such as column selection signals YI_2 through YI_n and output strobe signals IOSTB_2 through IOSTB_n based on the read command. While not shown in FIG. 1, the column selection signals YI_2 through YI_n and the output strobe signals IOSTB_2 through IOSTB_n are generated through various logic circuits such as delay circuits and buffer circuits. Accordingly, the times the read control signals are generated vary depending upon the PVT (process, voltage and temperature) properties of the second to nth chips C2-Cn. If the time between the read command application and the read control signals generation varies from chip to chip, it functions as an essential factor that to induces skews in the second to nth chips C2-Cn. When the skews are substantial, as illustrated above, the semiconductor apparatus may not operate at a high speed.

Therefore, according to the exemplary aspect of the present disclosure, the semiconductor apparatus 1 includes a reference clock generation unit 100 and first to nth chip synchronization units 200-1-200-n. The reference clock generation unit 100 provided in the first chip C1 generates a reference clock ref_clk from the read command. The reference clock generation unit 100 uses a signal CASP10 to generate the reference clock ref_clk, which may be obtained by delaying the read command by a predetermined amount of time. Preferably, the predetermined time correspond to a latency. The latency defines the elapsed time that begins with the read command's application to the semiconductor apparatus 1 and ends with the data output through the data pad DQ. The latency may be, for example, an additive latency, a CAS latency, etc. Of course, the present invention is not limited to such latency, and the reference clock ref_clk may be generated using a signal which is obtained by delaying the read command by a time shorter than the latency. Preferably, the reference clock ref_clk have a frequency lower than the external clock ex_clk because the external clock ex_clk inputted to the semiconductor apparatus 1 has a substantially high frequency to ensure high speed operation. However, a high frequency clock is not needed to generate the read control signals. Accordingly, the semiconductor apparatus 1 in accordance with the exemplary aspect of the present invention stably generates the read control signals of the first to nth chips C1-Cn using the reference clock ref_clk which has a frequency lower than the external clock ex_clk. The reference clock ref_clk is transmitted to the second to nth chips C2-Cn through other TSVs. Since TSVs generally have substantially large capacitors, it is inefficient to transmit clock signals through the TSVs. Therefore, the full swing of the reference clock ref_clk from a ground voltage to a power supply voltage is not required. A swing that allows the detection of the difference in voltage level is sufficient.

The first chip synchronization unit 200-1 receives the reference clock ref_clk and the read control signal of the first chip C1, delays the read control signal in sync with the reference clock ref_clk, and outputs a synchronized pipe latch control signal PIN_s. In other words, the first chip synchronization unit 200-1 synchronizes the pipe latch control signal PIN with the reference clock ref_clk, and generates the synchronized pipe latch control signal PIN_s.

The second to nth chip synchronization units 200-2-200-n receive the reference clock ref_clk and the read control signals of the respective chips, and output the read control signals in sync with the reference clock ref_clk. That is to say, the second to nth chip synchronization units 200-2-200-n delay the column selection signals YI_2 through YI_n and the output strobe signals IOSTB_2 through IOSTB_n in sync with the reference clock ref_clk, and generate the synchronized column selection signal YI_s and the to synchronized output strobe signal IOSTB_s.

Because the synchronized pipe latch control signal PIN_s, the synchronized column selection signal YI_s and the synchronized output strobe signal IOSTB_s are generated in sync with the reference clock ref_clk by the first to nth chips C1-Cn, the skews induced due to variations in the PVT properties of the first to nth chips C1-Cn may be significantly reduced. Since the synchronized column selection signal YI_s and the synchronized output strobe signal IOSTB_s of the second to nth chips C2-Cn are generated in sync with the reference clock ref_clk, the times taken from application of the read command application to the transmission of the respective chip data DATA_2-DATA_n to the TSVs may be maintained the same.

Figure 2:
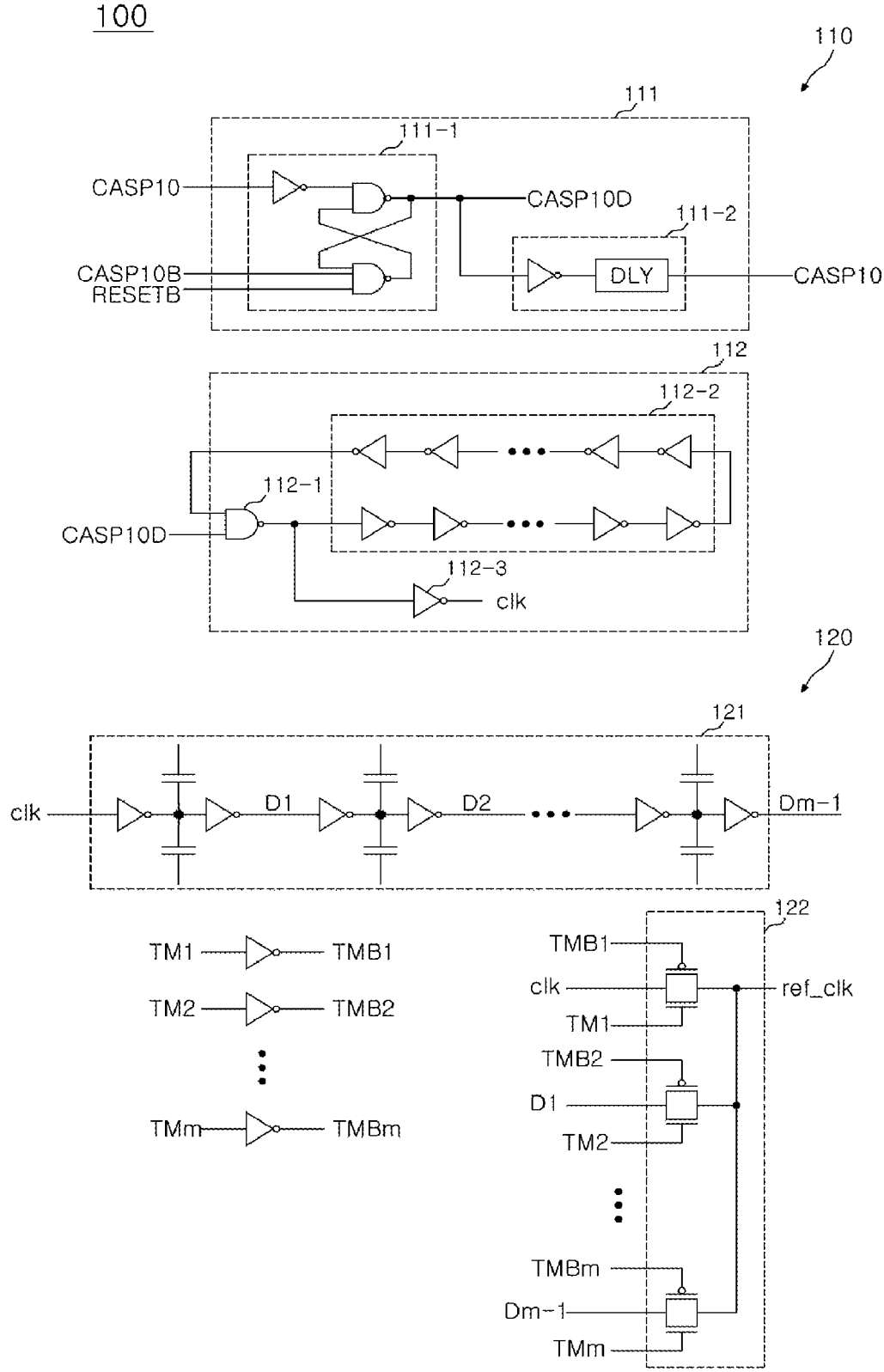
FIG. 2 is a circuit diagram illustrating the configuration of a reference clock generation unit shown in FIG. 1.

FIG. 2 is a circuit diagram illustrating the configuration of an exemplary aspect of the reference clock generation unit shown in FIG. 1. In FIG. 2, the reference clock generation unit 100 includes a period signal generation section 110 and a delay control section 120. The period signal generation section 110 receives the signal CASP10, the delayed signal of the externally applied read command by a predetermined time, and generates a period signal clk such as a clock. In FIG. 2, the period signal generation section 110 includes an enable part 111 and an oscillator 112. The enable part 111 receives the signal CASP10, the delayed signal of the read command by the predetermined time, and generates an enable signal CASP10D which has a preset pulse width. The oscillator 112 generates the period signal clk in response to the enable signal CASP10D. The oscillator 112 may generate the period signal clk when the enable signal CASP10D is enabled.

In FIG. 2, the enable part 111 includes an RS flip-flop 111-1 and a delay 111-2. The RS flip-flop 111-1 enables the enable signal CASP10D when the signal CASP10 obtained by delaying the read command by a predetermined time is enabled to a high level. The delay 111-2 receives the enable signal CASP10D and delays the enable signal CASP10D by a preset time. The delay amount of the delay 111-2 may be set randomly. An output CASP10B of the delay 111-2 is inputted again to the RS flip-flop 111-1. If the output CASP10B of the delay 111-2 is inputted, the RS flip-flop 111-1 disables the enable signal CASP10D. Further, if a reset signal RESETB is enabled for initialization, the enable signal CASP10D may be disabled.

The oscillator 112 includes a NAND gate 112-1 and an inverter chain 112-2 composed of even-numbered inverters. The NAND gate 112-1 receives the output of the final inverter of the inverter chain 112-2 and the enable signal CASP10D. The output of the NAND gate 112-1 is not only inputted to the first inverter of the inverter chain 112-2 but also inputted to the input terminal of an inverter 112-3, which outputs the period signal clk. Therefore, the oscillator 112 may generate the period signal clk, which periodically toggles during intervals for which the enable signal CASP10D is enabled.

The delay control section 120 delays the period signal clk which is generated by the oscillator 112 and outputs the reference clock ref_clk. In response to test mode signals TM<1:m>, the delay control section 120 may change the delay amount of the period signal clk.

The delay control section 120 includes a plurality of unit delays 121 and a plurality of pass gates 122. Each of the unit delays 121 is composed of two inverters and a capacitor. The plurality of unit delays 121 are connected in series, sequentially delay the period signal clk, and generate a plurality of delayed signals D1-Dm−1. The plurality of pass gates 122 may turn on in response to The test mode signals TM<1:m> may activate the plurality of pass gates 122, which output the delayed signals clk and D1-Dm−1, respectively. Therefore, if test mode signals TM<1:m> enable if specified test mode signals the delayed signals clk and D1-Dm−1 may be generated as the reference clock ref_clk.

Figure 3:
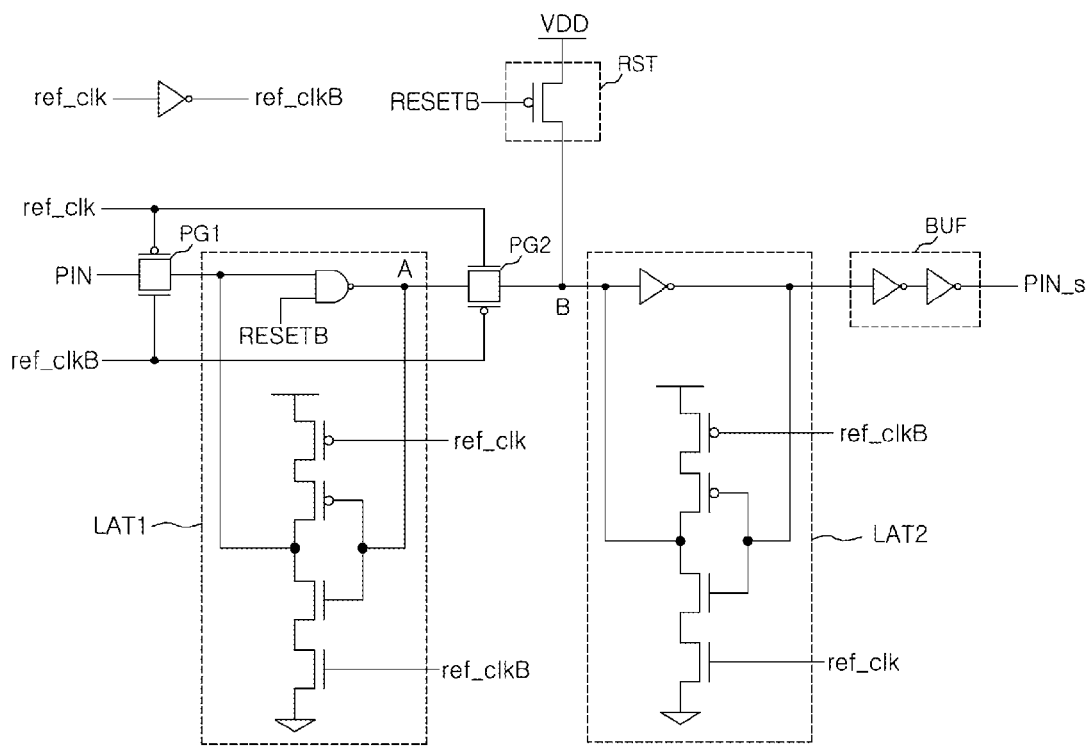
FIG. 3 is a circuit diagram illustrating the configuration of a first chip synchronization unit shown in FIG. 1.

FIG. 3 is a circuit diagram illustrating the configuration of an exemplary aspect of the first chip synchronization unit shown in FIG. 1. In FIG. 3, the first chip synchronization unit 200-1 receives the pipe latch control signal PIN and outputs the pipe latch control signal PIN in sync with the reference clock ref_clk. In FIG. 3, the first chip synchronization unit 200-1 includes first and second pass gates PG1 and PG2, a first latch section LAT1, a second latch section LAT2, a reset section RST, and a buffer section BUF. The reference clock ref_clk and its inverted signal ref_clkB control the first and second pass gates PG1 and PG2. When the reference clock ref_clk has a low level, first pass gate PG1 is turned on. When the reference clock ref_clk has a low level, the pipe latch control signal PIN passes through the first pass gate PG1 and transfers its voltage level to the first latch section LAT1. In other words, the first latch section LAT1 latches the voltage level of a first node A. The second pass gate PG2 is turned on when the reference clock ref_clk has a high level. When the reference clock ref_clk has a high level, the pipe latch control signal PIN passes through the second pass gate PG2 and transfers its voltage level to the second latch section LAT2. In other words, the second latch section LAT2 latches the voltage level of a second node B. The buffer section BUF buffers the output of the second latch section LAT2 and outputs the synchronized pipe latch control signal PIN_s. Accordingly, the first chip synchronization unit 200-1 may latch the level of the pipe latch control signal PIN when the reference clock ref_clk has a low level, and output the latched signal when the reference clock ref_clk has a high level. The synchronized pipe latch control signal PIN_s, which is outputted from the first chip synchronization unit 200-1, may have a pulse width corresponding to one period of the reference clock ref_clk.

The reset section RST may apply a power supply voltage VDD to the first latch section LAT1 and the second node B when the reset signal RESETB is enabled, and initialize the first chip synchronization unit 200-1. As the reset signal RESETB, the initializing signal of the semiconductor apparatus 1 may be used.

The second to nth chip synchronization units 200-2-200-n have the same configuration as the first chip synchronization unit 200-1. However, since the second to nth chip synchronization units 200-2-200-n synchronize the column selection signals YI_2 through YI_n and the output strobe signals IOSTB_2 through IOSTB_n with the reference clock ref_clk, it is sufficient that the configuration of the first chip synchronization unit 200-1 is provided by two.

According to the above descriptions, read control signals for controlling the read operations of a plurality of chips constituting a single semiconductor apparatus are generated in sync with the same reference clock. As a consequence, the skews of the plurality of stacked chips may be reduced, and data may be stably outputted even though the semiconductor apparatus operates at a high speed.

While certain exemplary aspects have been described above, it will be understood to those skilled in the art that the exemplary aspects described are by way of example only. Accordingly, the semiconductor apparatus described herein should not be limited based on the described exemplary aspects. Rather, the semiconductor apparatus described herein should only be limited in light of the claims that follow when taken in conjunction with the above description and accompanying drawings.

What is claimed is:

1. A semiconductor apparatus having first and second chips stacked therein, comprising:
   a reference clock generation unit provided in the first chip and configured to generate a reference clock based on a read command; and
   a synchronization unit of the second chip provided in the second chip and configured to output read control signals of the second chip which are generated based on the read command in sync with the reference clock,
   wherein the reference clock is generated from a signal which is obtained by delaying the read command by a predetermined time,
   wherein the reference clock generation unit comprises a period signal generation section configured to generate a period signal in response to the signal which is obtained by delaying the read command by the predetermined time and a delay control section configured to delay the period signal in response to a test mode signal and generate the reference clock.

2. The semiconductor apparatus according to claim 1, further comprising:
   a synchronization unit of the first chip provided in the first chip and configured to output the read control signal of the first chip in sync with the reference clock.

3. The semiconductor apparatus according to claim 2, wherein the read control signal of the first chip comprises a pipe latch control signal.

4. The semiconductor apparatus according to claim 1, wherein the read control signals of the second chip comprise a column selection signal and an output strobe signal.

5. The semiconductor apparatus according to claim 1, wherein the reference clock is transmitted to the second chip through a Through Silicon Via (TSV).

6. The semiconductor apparatus according to claim 1, wherein the reference clock has a frequency lower than an external clock.

7. The semiconductor apparatus according to claim 1, wherein the period signal generation section comprises:
   an enable part configured to receive the signal which is obtained by delaying the read command by the predetermined time and generate an enable signal which has a preset pulse width;
   an oscillator configured to generate the period signal in response to the enable signal.

8. The semiconductor apparatus according to claim 7, wherein the predetermined time corresponds to a latency.

* * * * *